United States Patent [19]

Dei

[11] Patent Number: 4,831,392

[45] Date of Patent: May 16, 1989

[54] IMAGE PROCESSING APPARATUS USING PULSE WIDTH MODULATION WITH IMPROVED SENSITIVITY

[75] Inventor: Katsuhito Dei, Tokyo, Japan

[73] Assignee: Canon Kabushiki Kaisha, Tokyo, Japan

[21] Appl. No.: 235,761

[22] Filed: Aug. 23, 1988

Related U.S. Application Data

[63] Continuation of Ser. No. 12,541, Feb. 9, 1987, abandoned.

[30] Foreign Application Priority Data

Feb. 13, 1986 [JP] Japan .................................. 61-27981
Feb. 13, 1986 [JP] Japan .................................. 61-27982

[51] Int. Cl.$^4$ ............................................ H03K 13/00
[52] U.S. Cl. .................................... 364/519; 346/154
[58] Field of Search ............. 346/154, 76 PH, 139 C; 358/281, 284, 280, 78, 300; 364/518, 519, 180, 182; 400/119; 101/DIG. 13

[56] References Cited

U.S. PATENT DOCUMENTS 4,685,069 8/1987 Inui et al. .............................. 364/519
4,736,315 4/1988 Ozaki et al. .......................... 364/518

FOREIGN PATENT DOCUMENTS 0205174 1/1982 Japan ............................... 346/76 PH
0205179 1/1982 Japan ............................... 346/76 PH Primary Examiner—Arthur G. Evans
Attorney, Agent, or Firm—Fitzpatrick, Cella, Harper & Scinto

[57] ABSTRACT

An image processing apparatus includes an image signal generator for generating an image signal, an edge detector for detecting an edge of the image signal, a triangle wave generator for generating a reference signal, a multiplier or subtracting circuit for modulating the reference signal on the basis of a detection output from the edge detector and outputting a modulated reference signal, and a comparator for processing the image signal from the image signal generator by using the modulated reference signal and for generating a pulse width modulated signal.

16 Claims, 7 Drawing Sheets

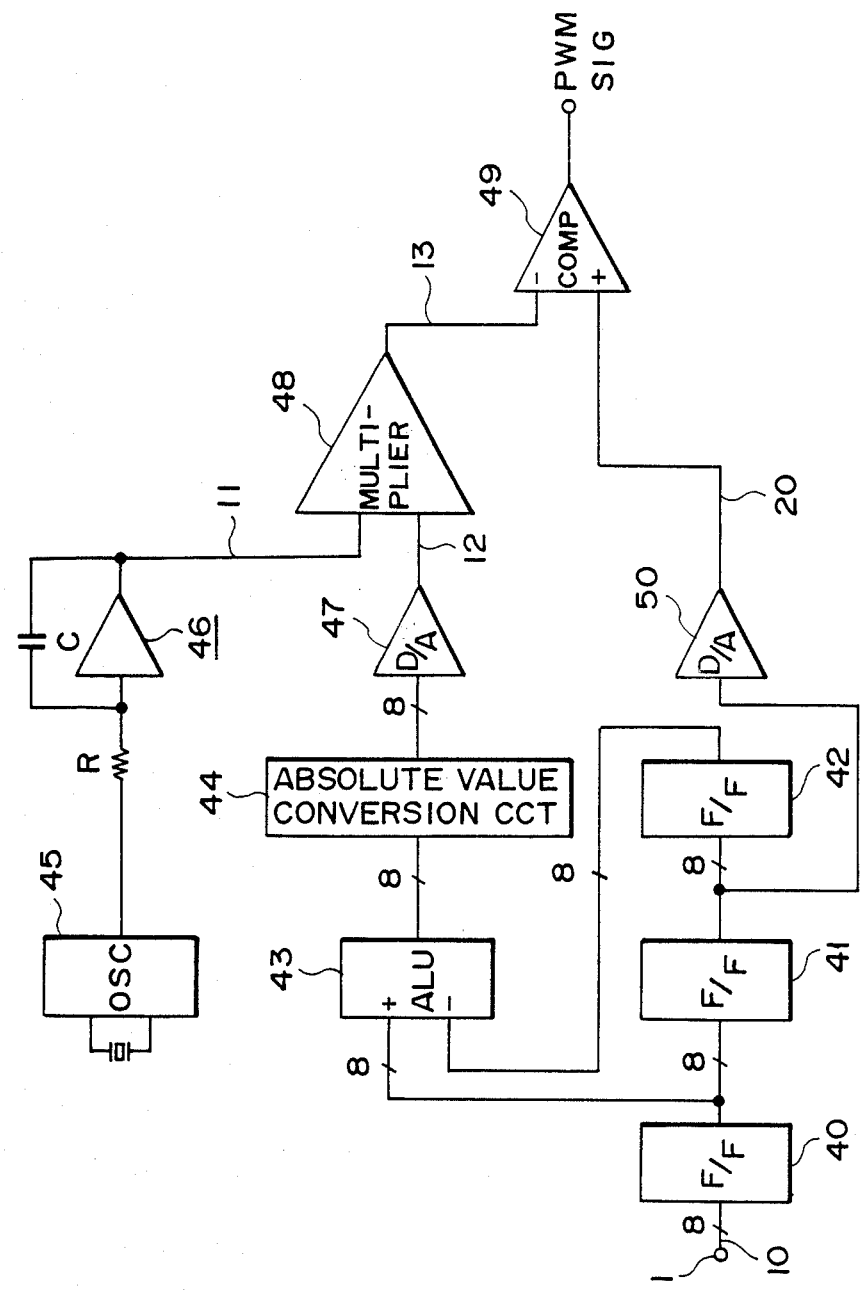
F I G. 4

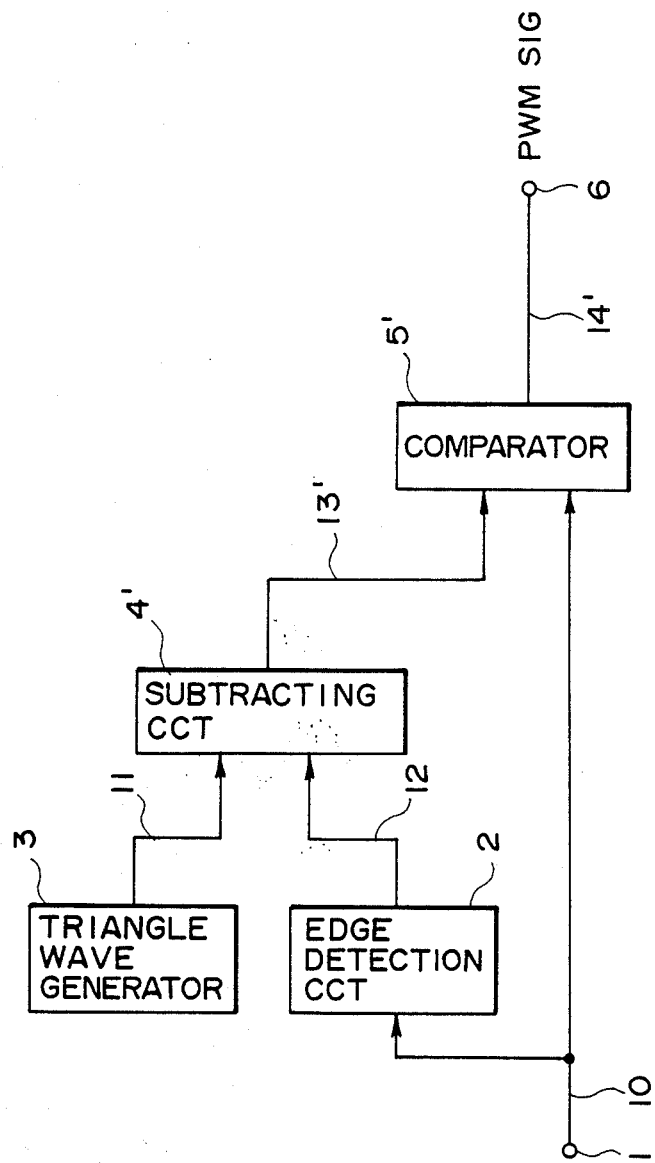
F I G. 5

IMAGE PROCESSING APPARATUS USING PULSE WIDTH MODULATION WITH IMPROVED SENSITIVITY

This application is a continuation of application Ser. No. 012,541 filed Feb. 9, 1987, now abandoned.

BACKGROUND OF THE INVENTION

1. Field of the Invention

The present invention relates to an image processing apparatus for reproducing an image.

2. Related Background Art

In a conventional image apparatus of this type, a triangle or saw-tooth wave as a reference wave is generated and input to one input terminal of comparator, and multivalue image data is converted into analog data and is input to the other input terminal of the comparator to perform pulse width modulation. However, if a change in the input image signal is short as compared with the period of the triangle wave, an abrupt change in part of the input image signal is concealed in the upper or lower peak of the triangle wave being used as a reference wave. Therefore, the abrupt change in input image signal does not appear in the PWM output.

SUMMARY OF THE INVENTION

It is an object of the present invention to eliminate the conventional drawback described above.

It is another object of the present invention to improve an image processing apparatus.

It is still another object of the present invention to provide an image processing apparatus capable of reproducing an image with high quality.

It is still another object of the present invention to provide an image processing apparatus capable of reproducing a good image with a simple arrangement.

It is still another object of the present invention to provide an image processing apparatus capable of reproducing an image with high quality at high speed.

It is still another object of the present invention to provide an image processing apparatus capable of reproducing an image having good gradation and a high resolution.

It is still another object of the present invention to provide an image processing apparatus capable of accurately reproducing an original image.

The above and other objects, features, and advantages of the present invention will be apparent from the following description and the appended claims in conjunction with the accompanying drawings.

BRIEF DESCRIPTION OF THE DRAWINGS

FIG. 4 is a diagram showing the detailed arrangement of the modulator according to the first embodiment;

FIG. 5 is a block diagram of a modulator in an image processing apparatus according to a second embodiment of the present invention;

DETAILED DESCRIPTION OF THE PREFERRED EMBODIMENTS

The preferred embodiments of the present invention will be described in detail with reference to the accompanying drawings.

(First Embodiment)

(Description of Pulse Width Modulator (FIG. 1))

Figure 1:
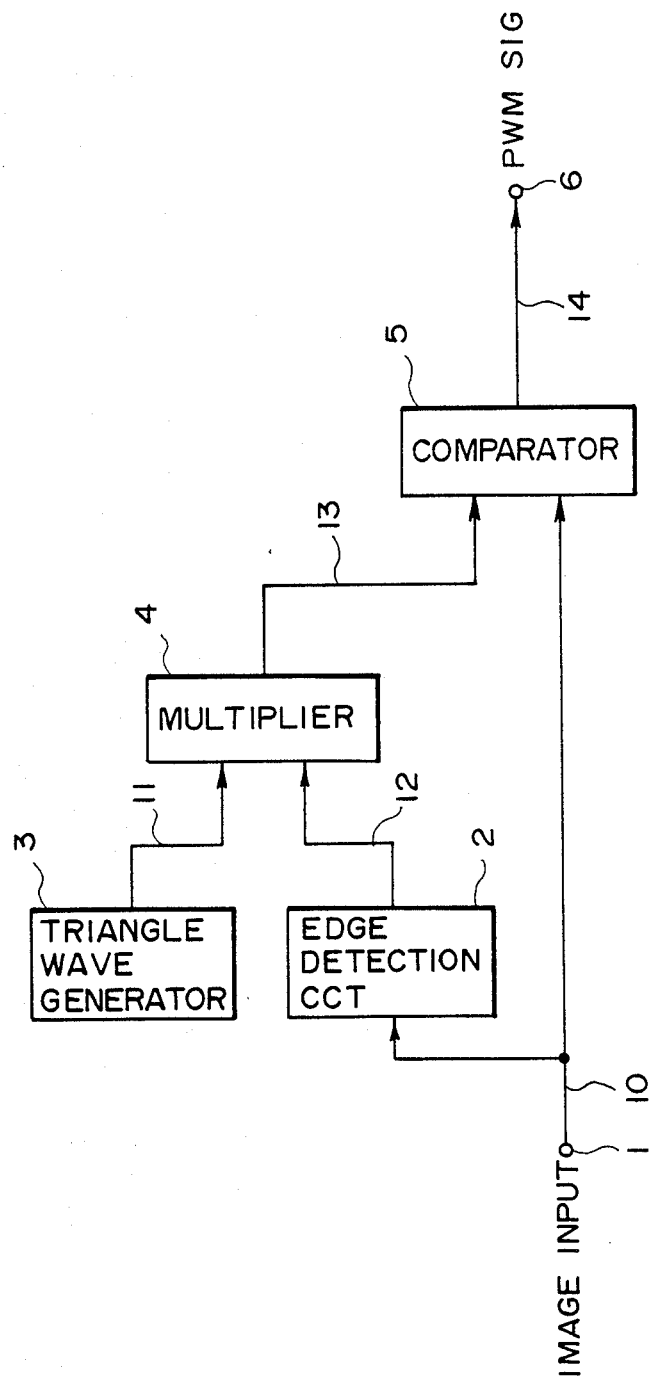
FIG. 1 is a block diagram of a modulator in an image processing apparatus according to a first embodiment of the present invention.

FIG. 1 is a block diagram of a pulse width modulator in an image processing apparatus according to a first embodiment of the present invention.

An edge detector 2 is connected to an image signal input terminal 1 and detects an edge (an abrupt change in density of image) of an image signal 10 input to the image signal input terminal 1. The output terminal of the edge detector 2 is connected to one input terminal of a multiplier 4. The other input terminal of the multiplier 4 is connected to the output terminal of a triangle wave generator 3. The multiplier 4 receives a triangle wave (reference signal) 11 generated by the triangle wave generator 3 and an edge signal 12 generated by the edge detector 2 and multiplies the input signals. The output terminal of the multiplier 4 is connected to one input terminal of a comparator 5. The other input terminal of the comparator 5 is connected to the image signal input terminal 1. The comparator 5 thus receives an output 13 as the reference signal generated by the multiplier 4 and the image signal 10 and PWM-modulates the input signal 10. Therefore, the comparator 5 generates a binary signal 14 as a PWM output.

(Description of Timings (FIGS. 2 and 3))

Figure 2:
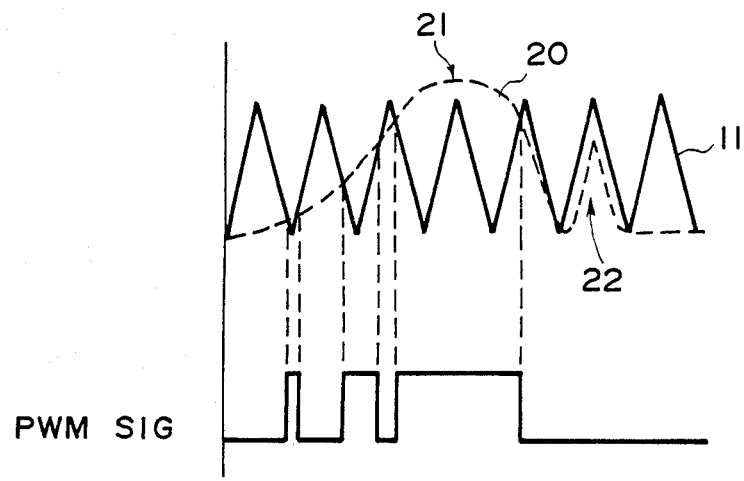
FIG. 2 is a timing chart of a conventional modulator.

FIG. 2 is a timing chart of a PWM signal generated by a conventional pulse width modulator.

FIG. 2 shows the triangle wave 11 as the output from the triangle wave generator 3 and a waveform 20 (a broken line) obtained by analog-converting the input image signal 10. The PWM signal is an output signal from the comparator 5 for generating a signal of high level if the image signal 20 has a magnitude larger than that of the triangle wave 11. A moderate peak 21 of the image signal 20 can be desirably PWM-modulated by the triangle wave 11. However, a steep peak 22 of the image signal 20 is concealed in the 6th peak of the triangle wave 11. Even if the peak 22 is sufficiently high, the resultant PWM output wave is kept at low level. This leads to omission of thin lines when an image is converted into binary data for reproduction. Therefore, the quality of the line image and characters is greatly degraded.

Figure 3:
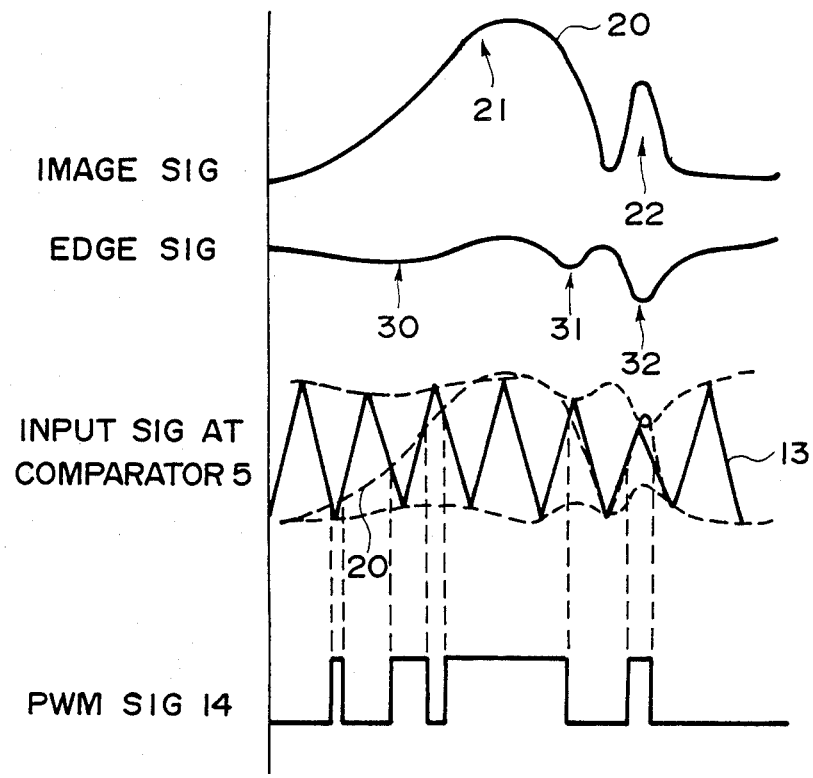
FIG. 3 is a timing chart of signals generated in the modulator of the first embodiment.

FIG. 3 is a timing chart of signals generated in the first embodiment.

For illustrative convenience, the absolute value of a signal proportional to the rate of change in image signal 20 is represented by reversing the sign of the edge signal 12. More specifically, the edge signal has a small negative peak 30 when the image signal 20 gradually rises. The edge signal also has a small negative peak 31 when the image signal gradually falls. When the image signal 20 abruptly changes, the edge signal has a large negative peak 32.

The product of the edge signal 12 and the triangle wave 11, which is calculated by the multiplier 4, is shown as a triangle wave 13 in FIG. 3. The image signal 20 obtained by analog-converting the input image signal 10 is compared with the triangle wave 13 by the comparator 5. If the magnitude of the image signal 20 is larger than that of the triangle wave 13, the comparator 5 generates a signal of high level. In this case, the output signal from the comparator 5 is shown as an output PWM signal 14 in FIG. 3.

As is apparent from FIG. 3, the moderately changing component 21 of the image signal 20 is correctly PWM-modulated. At the same time, a steeply changing component 22 is also accurately PWM-modulated. (Detailed Arrangement of Modulator (FIG. 4))

FIG. 4 is a block diagram showing the detailed arrangement of the modulator shown in FIG. 1.

The modulator includes D flip-flops (F/F) 40 to 42 connected in series with each other. The output terminal of the output F/F 42 is connected to the inverting input terminal of an arithmetic and logic unit (ALU) 43. An output from the F/F 40 is directly supplied to the noninverting input terminal of the ALU 43. The ALU 43 calculates a difference between the input signals supplied thereto. The output terminal of the ALU 43 is connected to the input terminal of an absolute value conversion circuit 44 comprising a ROM. The absolute value conversion circuit 44 receives an input address from the ALU 43 and generates the corresponding absolute value. The output terminal of the absolute value conversion circuit 44 is connected to the input terminal of a digital-to-analog (D/A) converter 47. The output terminal of the D/A converter 47 is connected to one input terminal of a multiplier 48. The other input terminal of the multiplier 48 is connected to an integrator 46. The integrator 46 comprises an analog amplifier, a capacitor C, and a resistor R and is connected to an oscillator 45. The output terminal of the F/F 41 is directly connected to the input terminal of a D/A converter 50. The output terminal of the D/A converter 50 is connected to the noninverting input terminal of a comparator 49. The inverting input terminal of the comparator 49 is connected to the output terminal of the multiplier 48.

The operation of the modulator having the arrangement as described above will be described below. 8-bit digital image data 10 input to the image input terminal 1 is latched by the F/F 40. The F/Fs 40 to 42 hold the image data in synchronism with 3 pixel clocks (not shown). The ALU 43 receives the image, data obtained at a timing two clocks earlier and the latest image data and calculates the difference therebetween. The absolute value conversion circuit 44 generates the absolute value of the difference. The absolute value is converted by the D/A converter 47 into an analog signal. The analog signal is input to one input terminal of the multiplier 48. The output from the D/A converter 47 corresponds to the edge signal 12 in FIG. 1. Although the sign of the signal 12 is reversed, the waveform is the same as that of the edge signal in FIG. 3.

An output from the oscillator 45 is a rectangular wave having a 50% duty ratio. The output is integrated by the integrator 46 having a proper time constant. The rectangular wave is converted into the triangle wave 11 having a predetermined period, as shown in FIG. 2. The triangle wave 11 is input to the other input terminal of the multiplier 48. The multiplier 48 comprises an analog multiplier such as a double balanced modulator. The triangle wave 11 is amplitude-modulated by the edge signal 12.

The edge signal 12 currently output from the D/A converter 47 corresponds to the image data stored in the F/F 41. Therefore, the input image signal 20 in the comparator 49 is a signal obtained by analog-converting the output from the F/F 41 by the D/A converter 50. In this manner, a two-clock delayed PWM signal is generated by the comparator 49.

In the first embodiment, the edge detector 2 is FIG. 1 performs digital one-dimensional differentiation of first order. However, the edge detector 2 may perform two-dimensional differentiation of the first order or analog differentiation without departing from the scope of the present invention.

The absolute value conversion circuit 44 shown in FIG. 4 comprises a ROM. However, the absolute value conversion is not limited to:

$$OUT=|IN|$$

but can be replaced with $$OUT=1-|IN|$$

or $$OUT=1/|IN|$$

The triangle wave generator is not limited to a quartz oscillator and integrator; saw-tooth wave generator may be used instead.

According to the first embodiment, in the pulse width modulator for converting an analog signal into binary data with reference to the triangle or saw-tooth wave signal, the reference wave is amplitude-modulated by a derivative of the analog signal to be used for comparison, so that the input signal having a frequency component higher than the repetition period of the reference wave can be accurately digitized.

A black or white thin line, therefore, can be reproduced with accuracy.

(Second Embodiment)

A second embodiment of the present invention will be described with reference to FIGS. 5 to 7 and FIG. 2. The same reference numerals as in FIGS. 1 to 4 denote the same parts in FIGS. 5 to 7.

(Description of Pulse Width Modulator (FIG. 5))

FIG. 5 i a block diagram of a pulse width modulator in an image processing apparatus according to a second embodiment of the present invention.

An edge detector 2 is connected to an image signal input terminal 1 and detects an edge (an abrupt change in density of image) of an image signal 10 input to the image signal input terminal 1. The output terminal of the edge detector 2 is connected to one input terminal of a subtracting circuit 4'. The other input terminal of the subtracting circuit 4' is connected to the output terminal of a triangle wave generator 3. The subtracting circuit 4' receives a triangle wave (reference signal) 11 generated by the triangle wave generator 3 and an edge signal 12 generated by the edge detector 2 and calculates a difference between the input signals. The output terminal of the subtracting circuit 4' is connected to one input terminal of a comparator 5'. The other input terminal of the comparator 5' is connected to the image signal input terminal 1. The comparator 5' thus receives an output 13' as the reference signal generated by the subtracting circuit 4' and the image signal 10 and PWM-modulates the input signal 10. Therefore, the comparator 5' generates a binary signal 14' as a PWM output.

(Description of Timings (FIGS. 2 to 6))

FIG. 2 is the timing chart of a PWM signal generated by a conventional pulse width modulator, as described above.

FIG. 2 shows the triangle wave 11 as the output from the triangle wave generator 3 and a waveform 20 (a broken line) obtained by analog-converting the input image signal 10. The PWM signal is an output signal from the comparator 5' for generating a signal of high level if the image signal 20 has a magnitude larger than that of the triangle wave 11. A moderate peak 21 of the image signal 20 can be desirably PWM-modulated by the triangle wave 11. However, a steep peak 22 of the image signal 20 is concealed in the 6th peak of the triangle wave 11. Even if the peak 22 is sufficiently high, the resultant PWM output wave is kept at low level. This leads to omission of thin lines when an image is converted into binary data for reproduction. Therefore, the quality of the line image and characters is greatly degraded.

Figure 6:
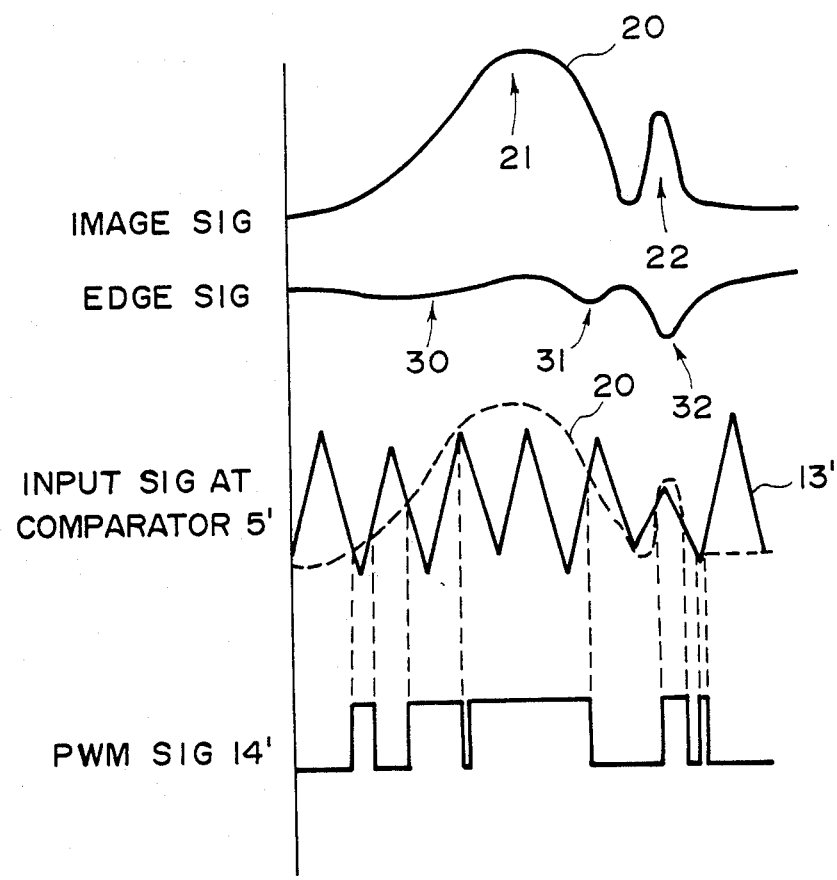
FIG. 6 is a timing chart of signals generated in the modulator according to the second embodiment.

FIG. 6 is a timing chart of signals generated in the second embodiment.

For illustrative convenience, the absolute value of a signal proportional to the range of change in image signal 20 is represented by reversing the sign of the edge signal 12. More specifically, the edge signal has a small negative peak 30 when the image signal 20 gradually rises. The edge signal has a small negative peak 31 when the image signal gradually falls. When the image signal 20 abruptly changes, the edge signal has a large negative peak 32.

The difference between the edge signal 12 and the triangle wave 11, which is calculated by the subtracting circuit 4', is shown as a triangle wave 13' in FIG. 6. The image signal 20 obtained by analog-converting the input image signal 10 is compared with the triangle wave 3' by the comparator 5'. If the magnitude of the image signal 20 is larger than that of the triangle wave 13', the comparator 5' generates a signal of high level. In this case, the output signal from the comparator 5' is shown as an output PWM signal 14' in FIG. 6.

As is apparent from FIG. 6, the moderately changing component 21 of the image signal 20 is correctly PWM-modulated. At the same time, a steeply changing component 22 is also accurately PWM-modulated.

(Detailed Arrangement of Modulator (FIG. 7))

Figure 7:
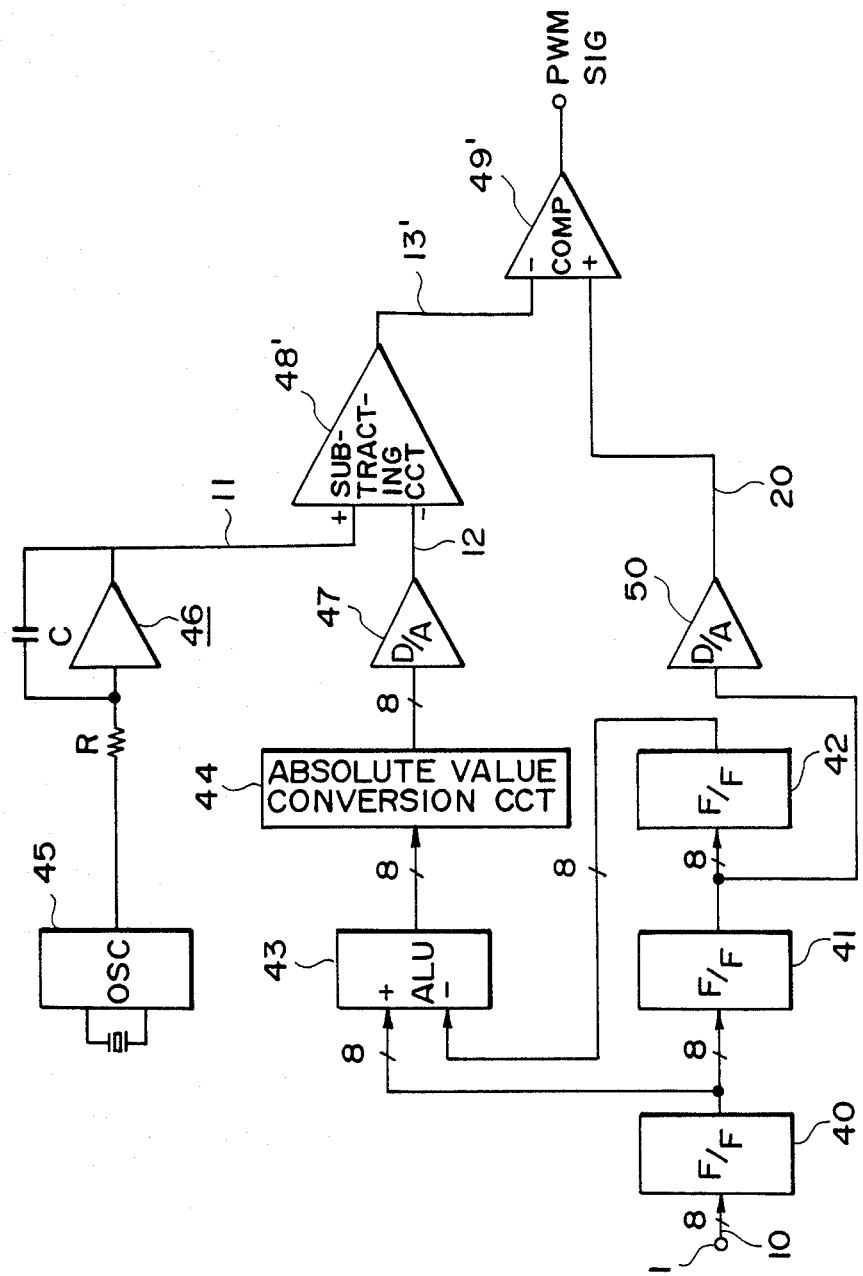
FIG. 7 is a diagram showing the detailed arrangement of modulator of the second embodiment.

FIG. 7 is a block diagram showing the detailed arrangement of the modulator shown in FIG. 5.

The modulator includes D flip-flops (F/F) 40 to 42 connected in series with each other. The output terminal of the output F/F 42 is connected to the inverting input terminal of an arithmetic and logic unit (ALU) 43. An output from the F/F 40 is directly supplied to the noninverting input terminal of the ALU 43. The ALU 43 calculates a difference between the input signals supplied thereto. The output terminal of the ALU 43 is connected to the input terminal of an absolute value conversion circuit 44 comprising a ROM. The absolute value conversion circuit 44 receives an input address from the ALU 43 and generates the corresponding absolute value. The output terminal of the absolute value conversion circuit 44 is connected to the input terminal of a digital-to-analog (D/A) converter 47. The output terminal of the D/A converter 47 is connected to one input terminal of a subtracting circuit 48'. The other input terminal of the subtracting circuit 48' is connected to an integrator 46. The integrator 46 comprises an analog amplifier, a capacitor C, and a resistor R and is connected to an oscillator 45. The output terminal of the F/F 41 is directly connected to the input terminal of a D/A converter 50. The output terminal of the D/A converter 50 is connected to the noninverting input terminal of a comparator 49'. The inverting input terminal of the comparator 49' is connected to the output terminal of the subtracting circuit 48'.

The operation of the modulator having the arrangement as described above will be described below. 8-bit digital image data 10 input to the image input terminal 1 is latched by the F/F 40. The F/Fs 40 to 42 hold the image data in synchronism with 3 pixel clocks (not shown). The ALU 43 receives the image data obtained at a timing two clocks earlier and the latest image data and calculates the difference therebetween. The absolute value conversion circuit 44 generates the absolute value of the difference. The absolute value is converted by the D/A converter 47 into an analog signal. The analog signal is input to one input terminal of the subtracting circuit 48'. The output from the D/A converter 47 corresponds to the edge signal 12 in FIG. 5. Although the sign of the signal 12 is reversed, the waveform is the same as that of the edge signal in FIG. 6.

An output from the oscillator 45 is a rectangular wave having a 50% duty ratio. The output is integrated by the integrator 46 having a proper time constant. The rectangular wave is converted into the triangle wave 11 having a predetermined period, as shown in FIG. 2. The triangle wave 11 is input to the other input terminal of the subtracting circuit 48'. The subtracting circuit 48' comprises a so-called operational amplifier and calculates a difference between the triangle wave 11 and the edge signal 12. The subtracting circuit 48' generates the reference input signal to the comparator 49'.

The edge signal 12 currently output from the D/A converter 47 corresponds to the image data stored in the F/F 41. Therefore, the input image signal 20 in the comparator 49' is a signal obtained by analog-converting the output from the F/F 41 by the D/A converter 50. In this manner, a two-clock delayed PWM signal is generated by the comparator 49'.

In the second embodiment, the edge detector 2 in FIG. 5 performs digital one-dimensional differentiation of first order. However, the edge detector 2 may perform two-dimensional differentiation of the first order or analog differentiation without departing from scope of the present invention.

The absolute value conversion circuit 44 shown in FIG. 7 is arranged to improve reproducibility of black thin lines but can be omitted. In this case, reproducibility of a black thin line at the central portion is slightly degraded, but reproducibility of a white thin line can be improved.

The triangle wave generator is not limited to a quartz oscillator and integrator; saw-tooth wave generator may be used instead.

According to the first embodiment, in the pulse width modulator for converting an analog signal into binary data with reference to the triangle or saw-tooth wave signal, the derivative of the analog signal to be compared is superposed on the reference signal. Therefore, an input signal having a frequency component higher than the repetition period of the reference wave can be converted into binary data with accuracy.

In the above embodiment, the analog pattern signal is a triangle wave, but may be replaced with another analog pattern signal such as a sine wave or a trapezoidal wave.

Figure 8:
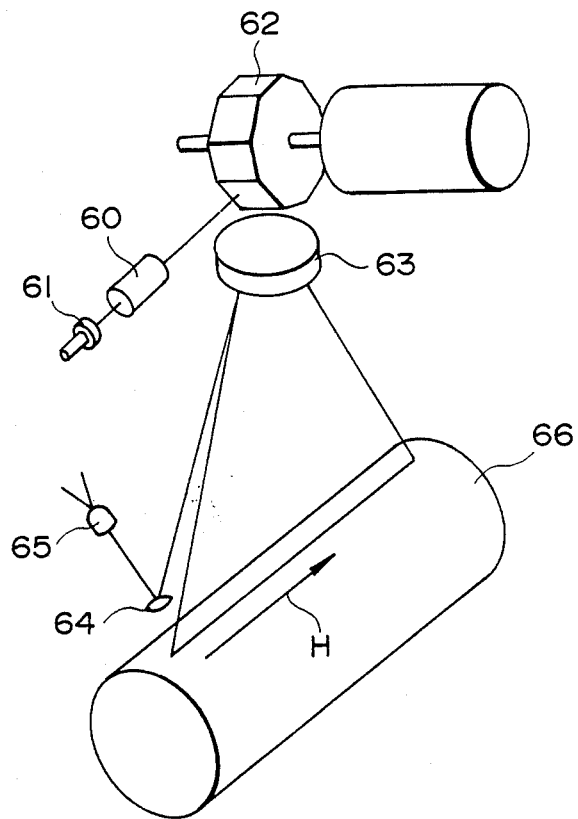
FIG. 8 is a schematic diagram of a laser beam printer to which the present invention can be applied.

FIG. 8 is a schematic perspective view of a scanning optical system of a laser beam printer (i.e., a raster scanning printer) to which the present invention can be applied. Referring to FIG. 8, the scanning system comprises a semiconductor laser for generating a laser beam mudulated in response to the PWM signal. A laser beam modulated by a semiconductor laser 61 is collimated by a collimator lens 60 and is deflected by a rotary polygonal mirror (an applying means) 62 having a plurality of reflecting surfaces. The deflected laser beam is focused by a focusing lens 63 called an f-θ lens onto a photosensitive drum 66. During beam scanning, the beam spot for one-line scanning is reflected by a mirror 64, and the reflected beam is guided to a beam detector (photosensor) 65. A beam detection (BD) signal from the beam detector 65 is used as a horizontal sync signal along the scanning direction H (horizontal direction).

The present invention is not limited to the particular embodiments as described above. Various changes and modifications may be made within the spirit and scope of the invention.

What is claimed is:

1. An image processing apparatus comprising:
    image signal generating means for generating an image signal;
    means for detecting a state of the image signal;
    reference signal generating means for generating a reference signal;
    means for modulating the reference signal generated by said image signal generating means on the basis of a detection output from said detecting means and outputting a modulated reference signal; and
    pulse width modulated signal generating means for processing the image signal from said image signal generating means for using the modulated reference signal and for generating a pulse width modulated signal.

2. An apparatus according to claim 1, wherein said detecting means detects a change in the image signal.

3. An apparatus according to claim 2, wherein said modulating and outputting means modulates an amplitude of the reference signal on the basis of the detection output from said detecting means.

4. An apparatus according to claim 1, wherein said image signal generating means generates an analog image signal, said reference signal generating means generates a reference signal having a predetermined period, and said pulse width modulated signal generating means comprises comparing means for comparing the analog image signal with the modulated reference signal and outputting the pulse width modulated signal.

5. An apparatus according to claim 1, wherein the reference signal comprises a triangle wave signal.

6. An apparatus according to claim 1, wherein said modulating and outputting means comprises means for operating on the detection output from the detecting means and the reference signal.

7. An image processing apparatus comprising:
    image signal generating means for generating an image signal;
    means for detecting a state of the image signal;
    means for generating an analog pattern signal;
    means for modulating the analog pattern signal generated by said analog pattern signal generating means on the basis of a detection output from said detecting means and for outputting a modulated analog pattern signal; and
    pulse width modulated signal generating means for processing the image signal from said image signal generating means by using the modulated analog pattern signal and for outputting the pulse width modulated signal.

8. An apparatus according to claim 7, wherein said detecting means detects a change in the image signal.

9. An apparatus according to claim 8, wherein said detecting means comprises means for differentiating the image signal.

10. An apparatus according to claim 8, wherein sai modulated analog pattern signal output means modulates an amplitude of the analog pattern signal on the basis of the detection output from said detecting means.

11. An apparatus according to claim 10, wherein said image signal generating means comprises first D/A converting means for converting a digital image signal into the analog image signal, said analog pattern signal generating means generates the analog pattern signal to have a predetermined period, and said pulse width modulated signal generating means comprises comparing means for comparing the analog image signal with the modulated analog pattern signal and for outputting the pulse width modulated signal.

12. An apparatus according to claim 10, wherein the analog pattern signal comprises a triangle wave signal.

13. An apparatus according to claim 8, wherein the detection output is digital, and wherein said modulated analog pattern signal output means comprises second D/A converting means for converting the digital detection output from said detecting means into an analog detection output and means for operating on the output from said second D/A converting means and the analog pattern signal.

14. An image processing apparatus comprising:
    image signal generating means for generating an image signal;
    detecting means for detecting if the image signal represents an edge portion of an image;
    analog pattern signal generating means for generating an analog pattern signal, said analog pattern generating means generating an analog pattern signal having an amplitude which depends on a detection output from said detecting means; and
    pulse width modulated signal generating means for processing the image signal from said image signal generating means by using the analog pattern signal generated by said analog pattern signal generating means and for outputting a pulse width modulated signal.

15. An apparatus according to claim 14, wherein the analog pattern signal is a triangular wave signal.

16. An apparatus according to claim 14, wherein said pulse width modulated signal generating means includes a comparator for comparing the image signal to the analog pattern signal.

* * * * *